United States Patent
Bouchez et al.

(10) Patent No.: US 6,372,541 B1
(45) Date of Patent: Apr. 16, 2002

(54) METHOD OF FABRICATING A MICROCIRCUIT CARD

(75) Inventors: Francois Bouchez, Verson; Jerome Bouvard, Ouistreham; Francois Launay, Epron; Pierre Loubly, Caen, all of (FR)

(73) Assignee: Oberthur Card Systems S.A., Paris (FR)

( * ) Notice: Subject to any disclaimer, the term of this patent is extended or adjusted under 35 U.S.C. 154(b) by 0 days.

(21) Appl. No.: 09/563,910

(22) Filed: May 4, 2000

(30) Foreign Application Priority Data

May 6, 1999 (FR) .............................................. 99 05779

(51) Int. Cl.$^7$ ................................................ H01L 21/44

(52) U.S. Cl. ......................... 438/106; 438/126; 438/964
(58) Field of Search ................................. 438/106, 126, 438/127, 125, 974, 964

(56) References Cited

U.S. PATENT DOCUMENTS

| 5,304,513 A | | 4/1994 | Haghiri-Tehrani et al. |
| 6,028,774 A | * | 2/2000 | Shin et al. |

FOREIGN PATENT DOCUMENTS

| EP | 0 472 766 | | 3/1992 |
| FR | 2 670 930 | | 6/1992 |
| FR | 2670930 A1 | * | 6/1992 |
| JP | 10240894 | * | 9/1998 |

\* cited by examiner

Primary Examiner—Caridad Everhart
(74) Attorney, Agent, or Firm—Browdy and Neimark, P.L.L.C.

(57) ABSTRACT

A method of fabricating a microcircuit card provides better control of the spreading of a hardenable coating material during fabrication of the microcircuit card. The surface of a support is treated to define at least two areas with different surface states and both extending beyond a predetermined location of the microcircuit. The deposit of the material is delimited by the configuration of these areas. The treatment is preferably applied by means of a laser beam.

18 Claims, 3 Drawing Sheets

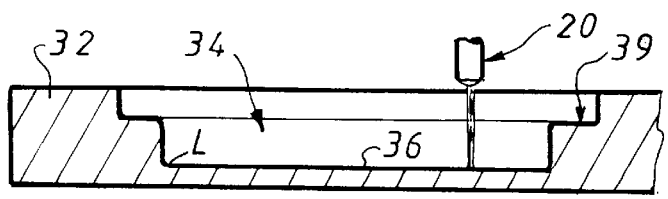
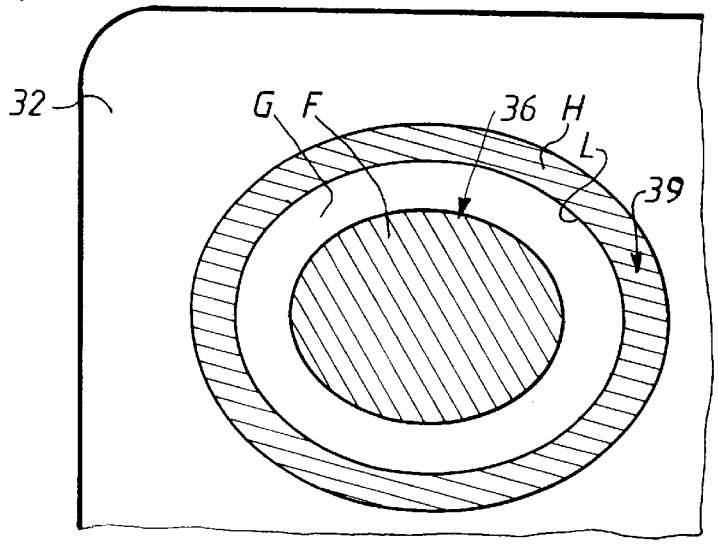
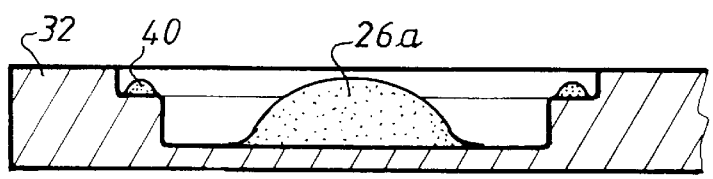
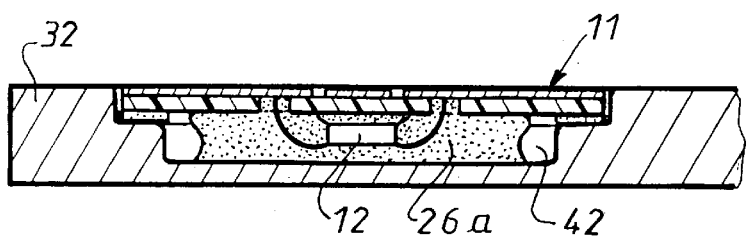
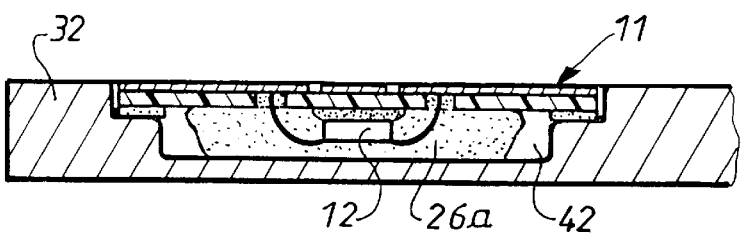

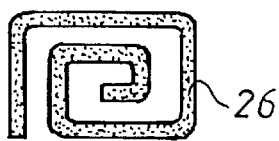
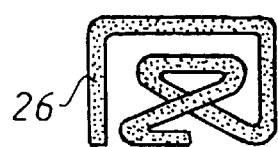
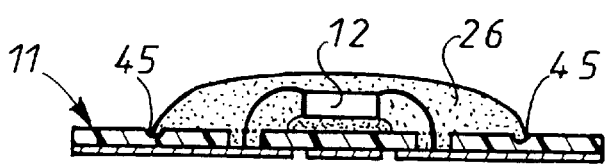
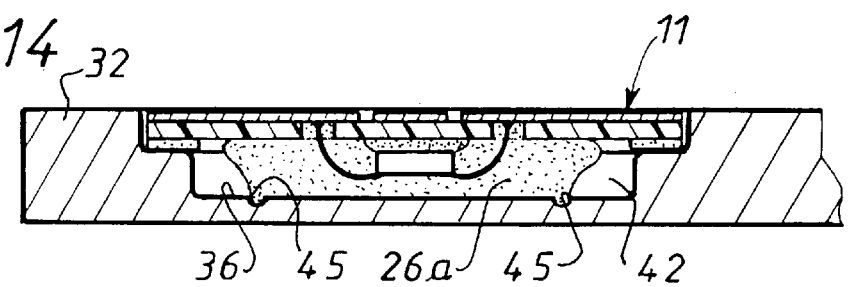
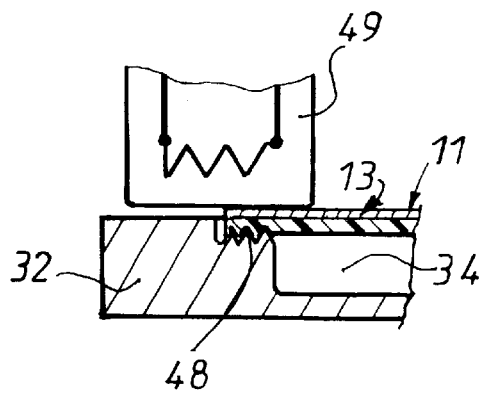

METHOD OF FABRICATING A MICROCIRCUIT CARD

BACKGROUND OF THE INVENTION

1. Field of the Invention

The invention relates to a method of fabricating a microcircuit card including in particular a step of coating the microcircuit with a hardenable coating material, typically a resin. It relates more particularly to improving the spreading of the coating material before hardening. The method advantageously also improves the adhesion of a resin or glue used during the fabrication of a microcircuit card.

2. Description of the Prior Art

Adapting the surface state of an article to improve the adhesion of glue to it is known in the art. For example, it is known that the surface energy (which can be expressed in joules/m$^2$) of a glue or resin can be matched to that of the surface on which the glue or resin is deposited to obtain good adhesion, which is conditioned by proper wetting of the support by the resin or glue concerned.

Generally speaking, it is known that wetting is improved if the surface is made rougher. In particular, treating a surface by means of a laser beam to change its surface state is known in the art. On the other hand, excessive wetting can lead to excessive spreading of the glue or resin beyond the required boundaries.

A general object of the invention is to employ surface treatment techniques and more particularly surface treatment by a laser beam to improve control of the spreading of a glue or resin in a given step of the fabrication of a microcircuit card, with the aim of improving the control of spreading and/or adhesion of a hardenable material, possibly a heat-activated material.

SUMMARY OF THE INVENTION

The invention provides a method of fabricating a card incorporating a microcircuit, the method including the steps of coating the microcircuit in a hardenable coating material, treating the surface of a support incorporated in the card to define thereon at least two areas which have different surface states and both of which extend beyond a predetermined location of the microcircuit and are substantially concentric with that location, and subsequently depositing the material in an area centered relative to that location so that the material engulfs the microcircuit and so that the spreading of the material is dependent on the shapes, dimensions and surface states of the aforementioned two areas.

For example, the treatment of the surface of a support can define at least two such areas of different roughness. One area is then the result of the surface treatment while the other can be an untreated surface having the original roughness of the support itself, which is generally smoother. The aforementioned treatment preferably employs a laser beam. A UV laser beam can be used, for example, whose high photonic energy breaks the covalent bonds of the polymer material at the surface without significantly heating the surface. This avoids deformation of the polymer material constituting the support. On the other hand, a YAG laser can be used to form an array of microcavities or microgrooves on the support, leading to a macroscopic increase in roughness over and above the effect of modifying the surface energy of the material by ablation of the surface layers.

The treatment enables the use of an adhesive to be dispensed with for certain operations, for example, for fixing a module at the required location on the card body. The plastics material support (the card) can be directly mechanically anchored in said microcavities by applying a heating tool to cause the plastics material of the card to flow into the microcavities of the treated area.

With regard to the main problem, namely that of controlling the spreading of the resin (in other words, confining it within required boundaries) during a given operation, a variant of the surface treatment can be used to define an annular groove around the location of the microcircuit to limit the spreading of the aforementioned material. The resin is therefore confined by capillary action within the area delimited by the groove, so stabilizing the mass of coating material on top of and all around the microcircuit. An annular groove of this kind can be formed on the surface of the connecting board and/or on the bottom of the cavity and at a particular distance from its perimeter.

The invention will be better understood and other advantages of the invention will become more clearly apparent in the light of the following description of several embodiments of the invention, which description is given by way of example only and with reference to the accompanying drawings.

BRIEF DESCRIPTION OF THE DRAWINGS

FIGS. 7 to 11 show more particularly another part of a method of fabricating a microcircuit card using the principle of the invention, more particularly including treatment of the card body and in particular surface treatment of a cavity.

FIGS. 12a and 12b show two ways to deposit glue or resin during execution of the process.

FIG. 13 shows a variant of the connecting board.

FIG. 14 shows a corresponding variant of the treatment of the bottom wall of the cavity.

FIG. 15 shows a variant of the fixing of the board.

DETAILED DESCRIPTION OF THE PREFERRED EMBODIMENTS

Figure 1:
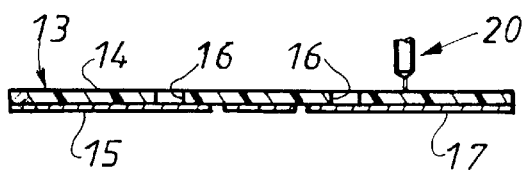
FIGS. 1 to 6 are diagrams showing the fabrication of a microcircuit connection board used in the process of fabricating a microcircuit card using surface treatment according to the invention.

The process of fabricating a module 11 carrying a microcircuit 12 and adapted to be mounted subsequently on another support, namely in a cavity formed for this purpose in a plastics material card body, will be described in detail with more particular reference to FIGS. 1 to 6. The module comprises a connecting board 13 which is generally made from a flexible film and has an insulative layer 14 and a metallic layer 15 in contact with each other. Connecting holes or wells 16 are made in the insulative part and the metallic part is cut to define connecting areas 17. In the conventional way, the microcircuit 12 is designed to be fixed to the center of the connecting board 13, on its insulative surface, and wires, generally gold wires, are soldered between its connecting face 12a and the connecting areas 17 through said connecting wells 16. The metalized films from which the connecting boards are cut out are generally made from polyimide, polyester or glassfiber-reinforced epoxy resin. When the connecting areas on the metalized side and the connecting wells on the insulative side have been defined by conventional processes, which are not described in detail here because they do not form any part of the invention, a connecting board as shown in FIG. 1 is obtained. It is at this stage that the principle of the invention can advantageously be applied. It entails localized surface treatment of predetermined areas of the insulative layer of the connecting board.

In the example, the surface treatment is applied by means of a laser beam 20. Laser beam treatment is currently the preferred embodiment of the invention.

Figure 2:
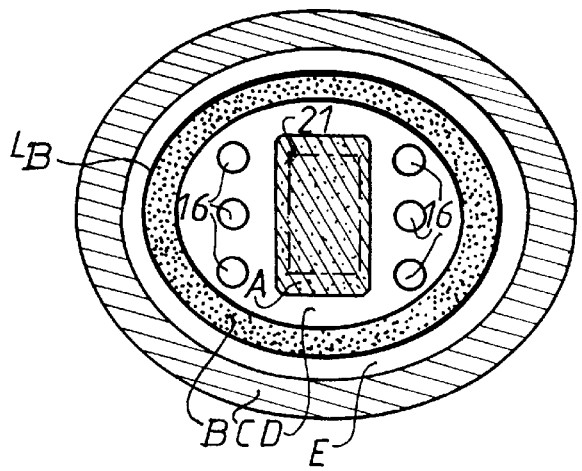

In accordance with the preceding definition, the application of the invention to the connecting board consists of treating the surface of the board by defining thereon at least two areas with different surface states extending beyond and substantially concentric with a predetermined location 21 of the microcircuit. FIG. 2 shows one example of a treated area. In this example, three areas A, B and C have been treated. These areas are not necessarily geometrically similar, but they are substantially centered relative to the location of the microcircuit. For example the innermost area A has almost the same shape as the microcircuit, but its area is larger than the area of the base of the microcircuit. However, this treated area does not reach the connecting wells 16, as can be seen in FIG. 2, and the outer boundaries of the area are clearly spaced from the connecting wells. The treatment of area A is advantageous but not indispensable.

Figure 5:
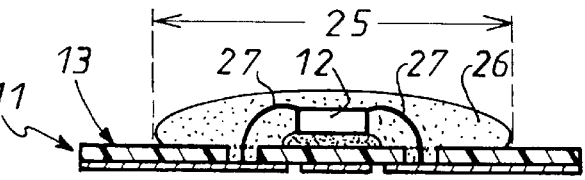

In contrast, the treatment of the annular area B is highly advantageous. This area is defined inside a required confinement area 25 of the material 26 for coating the microcircuit 12 (FIG. 5).

In other words, the line $L_B$ represents the required boundary of a drop of coating material subsequently deposited on the microcircuit 12 glued to the center of the board. This boundary is determined to guarantee good and continuous coating of the circuit, but the coating material (resin) must not extend beyond it, because if it did it would constitute an obstacle to subsequent fixing of the module into the prepared cavity in the card body.

According to a characteristic feature of the invention, the board is therefore treated over the area B inside the required confinement boundary $L_B$ and at least in the vicinity thereof (the treated area is therefore annular in shape, is not coincident with the area A and does not join onto the area A).

Finally, an annular area C of the board, separate from and outside the area B and near the edge of the board, is also treated. As explained below, this surface treatment improves subsequent fixing of the board into a cavity in another plane support forming a card body.

Figure 3:
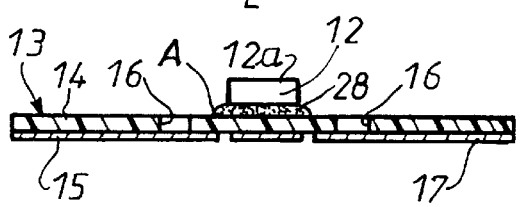

There are two untreated areas between the treated areas referred to above. The connecting wells are in an untreated area D between the area A and the area B. The other untreated area is an annular area E between the area B (i.e. beyond the required confinement boundary) and the inside edge of the area C. Because the area C is optional, the untreated area E can extend to the edge of the connecting board. The surface treatments of the areas A, B and C can be effected by means of the same laser beam but are generally differentiated (in terms of intensity, scanning speed, etc.) according to the hardenable materials (glue and/or resin) to be deposited subsequently. Be this as it may, the roughness of a treated area A, B or C will generally be higher than the roughness of an untreated area D or E and it is precisely the transition between a treated area and an untreated area, for example in the vicinity of the required confinement boundary $L_B$, that plays an important role in the behavior of the hardenable material when applied. A treated area, i.e. a roughened area, promotes good wetting of the surface by the hardenable material (glue or resin) because the surface energy of the treated area is greater than the surface energy of the untreated material. Thus treating area A improves the gluing of the microcircuit (FIG. 3) and if the material 28 (the glue) reaches the boundaries of the area A, it is more difficult for it to progress outward and so it does not spread beyond the boundaries of the area A, as shown in FIG. 3.

Consequently, when the microcircuit 12 is glued to the center of the board, the glue does not block the connecting wells 16.

Figure 4:
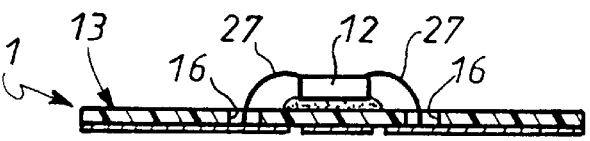

This facilitates and makes more reliable the electrical connection of the microcircuit by connecting wires 27 between its connecting areas and the connecting areas 17, as shown in FIG. 4. The gluing of the microcircuit is also improved.

The next operation, shown in FIG. 5, entails coating the microcircuit 12 and its connecting wires 27 with a drop of coating material which is required to cover all of the areas A and B including the microcircuit without extending beyond the boundary $L_B$. The coating material 26 is deposited by nozzles (not shown) over all of the central part of the connecting board. The nozzles are preferably moved along a predetermined path, for example that shown in FIG. 12a or 12b. The movement of the nozzles improves the distribution of the coating material over the surface concerned. If the material propagates onto the area B, the roughness of this area encourages natural outward flow of the material. However, if the boundary $L_B$ is reached, the outward flow of the material is stopped because it encounters here the area E of much lower surface energy. A coating material is preferably chosen whose surface energy is between that of the treated area (area B) and that of the externally adjacent untreated area (area E). FIG. 5 shows the result of this, which is that the coating material is confined within the required boundary $L_B$. This confinement guarantees that the module obtained can be placed in the cavity in the card body without difficulty and without requiring any additional operation.

Figure 6:
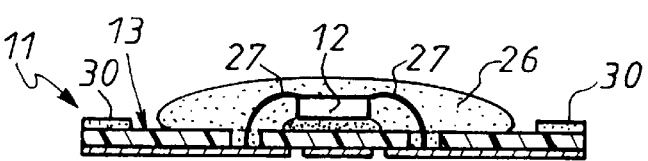

FIG. 6 shows an optional additional operation which consists of depositing a ring of glue 30 over the annular area C, if present. The glue is a heat-activated glue, for example. By appropriately choosing the surface energy imparted to the area C by the laser beam treatment, knowing the nature of the glue, adhesion can be further improved in this area and/or the boundaries of the glue deposit can be controlled better.

FIGS. 7 to 10 show application of the invention to the treatment of surface parts of the plastics material card body 32 in which a cavity 34 is formed to receive a module 11. Here the module is in the state shown in FIG. 4, i.e. it has not undergone the coating phase shown in FIG. 5.

In this example, the cavity 34 has a flat bottom 36 with a boundary L. On the open side, the cavity widens to form a margin 39. The depth of the margin corresponds to the thickness of the connecting board and possibly the thickness of the layer of glue for fixing the connecting board. When the module is in place, the microcircuit 12 is in the deeper part of the cavity 34.

If the module has been coated, as shown in FIG. 5, it is overturned in the cavity and fixed only to the margin thereof. There is, however, a variant of the process in which the coating material is deposited on the flat bottom 36 of the cavity. This coating technique is described in European patent 0 414 314, for example.

The invention can therefore be applied to producing the card body and more particularly when preparing the cavity. In this case, the treatment is applied only to a central area and not to the whole of the bottom of the cavity, and defines a treated area F substantially centered relative to the bottom 36 of the cavity. An untreated area G therefore remains between the treated central area F and the perimeter of the bottom L of the cavity, excluding the margin.

It may be advantageous to apply at the same time another surface treatment to the margin to facilitate subsequent fixing of the module. This operation consists of treating at least one annular area H at the margin and is not indispensable, depending on the type of glue used to fix the module. The configuration obtained after the laser beam treatment is therefore that shown in FIG. 8.

The operation shown in FIG. 9 consists of depositing a hardenable coating material 26a over a central area of the cavity, i.e. over the area F. The module 11 from FIG. 4 is then placed in the cavity 34 in a position such that the microcircuit is engulfed in the hardenable material, as shown in FIG. 10. If glue 40 has been deposited on the margin, the same operation fixes the module. If heat-activated glue is used, the final fixing of the module can be performed subsequently, using a heating tool.

In FIG. 10, as in the previous example, the coating material 26a is naturally confined within the treated area F of the bottom of the cavity, its outward spreading being stopped at the transition between the treated area F and the untreated area G extending to the periphery L of the cavity.

As previously, the surface tension of the coating material is preferably chosen between that of the central treated area and that of the externally adjacent untreated area of the bottom of the cavity. Because the hardenable material does not reach the contour of the bottom of the cavity, a ring of air 42 is formed in the cavity, all around the microcircuit. The benefit of a ring of air of this kind (which can be obtained less easily if there is no treatment of the central area) is described in another patent application filed conjointly with the present application.

Preventing the material 26a from reaching the periphery of the bottom of the cavity very significantly reduces bending stresses in the vicinity of the bottom of the cavity.

If the module which is integrated into the cavity has a treated area B, as shown in FIG. 2, then the formation of the ring is improved and facilitated, the coating material taking the form shown in FIG. 11.

In the variants shown in FIGS. 13 and 14, the laser surface treatment is much more localized and deeper. Instead of a single surface treatment affecting only the roughness by modifying the surface energy of the material, an annular groove 45 is formed around the location of the microcircuit and limits the coating material and stops it spreading. The groove is preferably formed using a YAG laser. When the coating material is deposited at the center of the area delimited by the groove, it spreads outward until it is stopped by the groove. If this principle is applied to coating the microcircuit on the connecting board, the configuration shown in FIG. 13 is obtained. If this principle is applied to treating the bottom 36 of the cavity, and if the coating material 26a is deposited in the central part of the bottom of the cavity, the configuration shown in FIG. 14 is obtained when the module is placed in the cavity.

Finally, and as shown in FIG. 15 for example, macroscopic surface treatment can be applied to create an array of microcavities 48 in the area for fixing the connecting board 13, corresponding to the margin of the cavity. If these microcavities are sufficiently deep, in practice a few tens of microns deep, direct mechanical fixing of the card body 32 to the connecting board of the module can be obtained using a heating tool 49, by causing the plastics material of the card body to flow into the microcavities or microgrooves on the board. This avoids the need for adhesive to fix the module into the cavity of the card body. Successful experiments have been conducted using a 1064 nm 65 W YAG laser with a galvanometer head configured with a 160 mm diameter lens. Good results have been obtained on various plastics material supports, such as PBT (polybutylene terephthalate), and on more conventional materials such as PVC (polyvinyl chloride), PET (polyethylene terephthalate), polycarbonate or ABS (acrylonitrile butadiene styrene). The best results have been obtained with microcavities 80 to 100 microns in diameter and 20 microns deep with an array width of 300 microns.

There is claimed:

1. A method of fabricating a card containing a microcircuit, said method including the steps of:
    treating at least a first annular area of a support that is separated by a second area from a central area to give the first annular area a surface state that is different from the surface state of the second area and different from the surface state of a third area surrounding the first annular area such that spreading of flowable material out of the first annular area is inhibited by the differences in surface state;
    attaching the microcircuit to the central area; and
    coating the microcircuit by applying a flowable coating material around the microcircuit and onto the first, second and third areas.

2. The method claimed in claim 1 wherein said treatment of said surface of said support consists of defining at least two such areas of different roughness.

3. The method claimed in claim 1 wherein said treatment employs a laser beam.

4. The method claimed in claim 1 wherein said treatment is applied to the surface of a connecting board made from a flexible film, for example, and said microcircuit is fixed to said board to constitute a module adapted to be mounted on another support.

5. The method claimed in claim 4 wherein said board is treated over an area inside a required boundary of confinement of said material all around said predetermined location and at least in the vicinity thereof to obtain a significant reduction of surface energy at the transition between said treated area and an externally adjacent untreated area.

6. The method claimed in claim 5 using a hardenable material having a surface tension between that of said treated area and that of said externally adjacent untreated area.

7. The method claimed in claim 5 wherein an annular area of said board separate from said treated area is also treated to improve subsequent fixing of said board into a cavity in another plane support.

8. The method claimed in claim 5 wherein a central area of said board separate from said treated area in the vicinity of said confinement boundary and separated therefrom by connecting wells for connecting wires of said microcircuit is treated to improve subsequent gluing of said microcircuit to said board, said connecting wells being separate and at a distance from the boundaries of treated central area.

9. The method claimed in claim 4 wherein said treatment includes an operation of defining an annular groove around the location of said microcircuit to limit spreading of said material.

10. The method claimed in claim 7 wherein fixing said board entails heating a heat-activated adhesive deposited onto said annular area.

11. The method claimed in claim 7 wherein the treatment of said annular area includes the formation of microcavities or microgrooves therein and the operation of fixing said board consists of heating said annular area when in place on said other plane support to cause the material thereof to flow into said microcavities or microgrooves.

12. A method of fabricating a card incorporating a microcircuit, said method including the steps of coating said microcircuit in a hardenable coating material, treating the surface of a support incorporated in said card to define thereon at least two areas which have different surface states and both of which extend beyond a predetermined location of said microcircuit and are substantially concentric with said location, and subsequently depositing said material in an area centered relative to said location so that said material engulfs said microcircuit and so that the spreading of said material is dependent on the shapes, dimensions and surface states of said areas, wherein said treatment is applied to a central area of the bottom of a cavity formed in another plane support forming a card body, a hardenable material is deposited over said central area, a module comprising a connection board and a microcircuit mounted on said board is prepared in a manner that is known in the art, and said module is placed in said cavity in a position such that said microcircuit is engulfed in said hardenable material.

13. The method claimed in claim 12 wherein said central cavity area is at a distance from the contour of the bottom of said cavity so that said hardenable material does not reach said contour of said bottom of said cavity and leaves a ring of air in said cavity all around said microcircuit.

14. The method claimed in claim 13 using a hardenable material having a surface tension between that of said treated area and that of said externally adjacent untreated area.

15. The method claimed in claim 12 wherein a cavity is defined which further includes a margin having a height corresponding to the thickness of said board and said peripheral area is treated to favor a subsequent operation of gluing said board to said peripheral area.

16. The method of claim 1 wherein said step of treating is additionally performed on the central area before said step of attaching.

17. The method of claim 16 wherein the second area contains connecting wells for connecting wires of the microcircuit.

18. The method of claim 1 wherein the second area contains connecting wells for connecting wires of the microcircuit.

* * * * *